(12) United States Patent
Yin et al.

(10) Patent No.: US 11,462,403 B2
(45) Date of Patent: Oct. 4, 2022

(54) SEMICONDUCTOR STRUCTURE AND METHOD FOR MANUFACTURING SAME

(71) Applicant: SJ SEMICONDUCTOR (JIANGYIN) CORPORATION, JiangYin (CN)

(72) Inventors: Jiashan Yin, JiangYin (CN); Zuyuan Zhou, JiangYin (CN); Chengtar Wu, JiangYin (CN); Chengchung Lin, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 17/225,959

(22) Filed: Apr. 8, 2021

(65) Prior Publication Data

US 2022/0076951 A1 Mar. 10, 2022

(30) Foreign Application Priority Data

Sep. 4, 2020 (CN) .......................... 202010920921.5
Sep. 4, 2020 (CN) .......................... 202021912428.0

(51) Int. Cl.
  *H01L 21/02* (2006.01)
(52) U.S. Cl.
  CPC .. *H01L 21/02645* (2013.01); *H01L 21/02266* (2013.01); *H01L 21/02315* (2013.01); *H01L 21/02631* (2013.01)

(58) Field of Classification Search
None
See application file for complete search history.

(56) References Cited

U.S. PATENT DOCUMENTS

| | | | |
|---|---|---|---|
| 10,361,122 B1 * | 7/2019 | Hsieh | H01L 21/565 |
| 2018/0082933 A1 * | 3/2018 | Ko | H01L 21/568 |
| 2020/0273718 A1 * | 8/2020 | Cheng | H01L 21/56 |
| 2021/0098417 A1 * | 4/2021 | Kuo | H01L 21/6835 |
| 2022/0020700 A1 * | 1/2022 | Yeh | H01L 21/4857 |
| 2022/0076943 A1 * | 3/2022 | Yin | H01L 21/7684 |
| 2022/0078921 A1 * | 3/2022 | Nitta | H05K 3/3436 |

* cited by examiner

*Primary Examiner* — Alexander G Ghyka
(74) *Attorney, Agent, or Firm* — Alston & Bird LLP

(57) ABSTRACT

The present disclosure provides a semiconductor structure and a method for manufacturing the same. The method at least includes: applying a first wet etching to remove a Ti metal seed layer to expose a dielectric layer; performing a first pretreatment on the dielectric layer; forming a first groove in the dielectric layer to expose an interfacial Ti metal seed layer in the dielectric layer; applying a second wet etching to remove the interfacial Ti metal seed layer; and performing a second pretreatment on the dielectric layer to form a second groove with a depth greater than that of the interfacial Ti metal seed layer, which can effectively remove the interfacial Ti metal seed layer, and results in a depth difference between the bottom of the second groove and the interfacial Ti metal seed layer, thereby avoiding short circuits caused by the interfacial Ti metal seed layer, and improving device reliability.

6 Claims, 5 Drawing Sheets

SEMICONDUCTOR STRUCTURE AND METHOD FOR MANUFACTURING SAME

CROSS REFERENCE TO RELATED APPLICATION

The present application claims the benefit of priority to Chinese Patent Application No. CN 2020109209215, entitled "SEMICONDUCTOR STRUCTURE AND METHOD FOR MANUFACTURING SAME", filed with CNIPA on Sep. 4, 2020, the disclosure of which is incorporated herein by reference in its entirety, and Chinese Patent Application No. CN 2020219124280, entitled "SEMICONDUCTOR STRUCTURE", filed with CNIPA on Sep. 4, 2020, the disclosure of which is incorporated herein by reference in its entirety

FIELD OF TECHNOLOGY

The present disclosure generally relates to semiconductor chip manufacturing, in particular, to a semiconductor structure and method for manufacturing the same.

BACKGROUND

As functions of integrated circuits become stronger and their performance and integration level have improved, chip packaging technology has been playing an increasingly important role in integrated circuit products, and its value has occupied an ever larger proportion in the integrated circuit products. of At the same time, as the feature size of integrated circuits has reached an nanometer level and transistor density have become higher and clock frequencies turned faster, packaging density has also significantly increased.

Wafer-level packaging (WLP) takes a wafer as the processing object, encapsulates and tests the entire wafer, and then cuts the wafer into individual chips. WLP has the advantages of chip miniaturization, high integration, better performance, higher energy efficiency, and production low cost, so WLP has become an important packaging method for mobile/wireless devices, and it is currently one of the most promising packaging technologies.

Redistribution layers (RDLs) can rearrange the layout of chips' pads, so that the new layout meets the requirement of minimum depth difference of solder balls. The new pads are arranged in an array. For a high I/O chip package structure, multiple layers of RDL metal wires are required. With a certain shape and package size, the smaller the RDL metal wires have in differences of their line width or line depth, the more power supply rails can be designed and built. However, manufacturing RDLs requires relatively complex processes, including forming a titanium (Ti) metal seed layer and a dielectric layer over it. When forming the Ti metal seed layer, a small amount of Ti will diffuse into the dielectric layer. Therefore, when the Ti metal seed layer is removed by wet etching, some titanium atoms from the Ti metal seed layer will remain in the dielectric layer, and the remaining Ti metal seeds have the potential to cause a short circuit, which will reduce the reliability of the device.

SUMMARY

The present disclosure provides a method for manufacturing a semiconductor structure, which comprises: providing a supporting substrate, and forming a separation layer on the supporting substrate; forming a dielectric layer on the separation layer; forming a Ti metal seed layer on the dielectric layer; forming a Cu metal seed layer on the Ti metal seed layer; forming a photoresist layer on the Cu metal seed layer, and patterning the photoresist layer; forming a metal layer in contact with the Cu metal seed layer; removing the photoresist layer to expose the Cu metal seed layer; removing the Cu metal seed layer to expose the Ti metal seed layer; applying a first wet etching to remove the Ti metal seed layer to expose the dielectric layer; performing a first pretreatment on the dielectric layer, and forming a first groove in the dielectric layer to expose an interfacial Ti metal seed layer in the dielectric layer; applying a second wet etching to remove the interfacial Ti metal seed layer; and performing a second pretreatment on the dielectric layer to form a second groove with a depth greater than the depth of the interfacial Ti metal seed layer.

The present disclosure also provides a semiconductor structure, comprising: a supporting substrate; a separation layer on the supporting substrate; a dielectric layer on the separation layer, wherein the dielectric layer has a first groove and a second groove that are connected; a Ti metal seed layer on the dielectric layer, wherein the dielectric layer has a interfacial Ti metal seed layer, and the depth of the second groove is greater than the depth of the interfacial Ti metal seed layer; a Cu metal seed layer on the Ti metal seed layer; and a metal layer on the Cu metal seed layer.

DETAILED DESCRIPTION

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Within this document, terms such as 'above', 'on', 'below', 'top', 'bottom', 'horizontally' and 'vertically' should be construed with reference to the supporting substrate illustrated in the attached figures. In particular, a horizontal direction runs parallel to the substrate, and a vertical direction runs perpendicularly in and out of the substrate, with 'down' running deeper into the substrate, and 'up' leading to the surface, or 'top' of the device.

Figure 1:
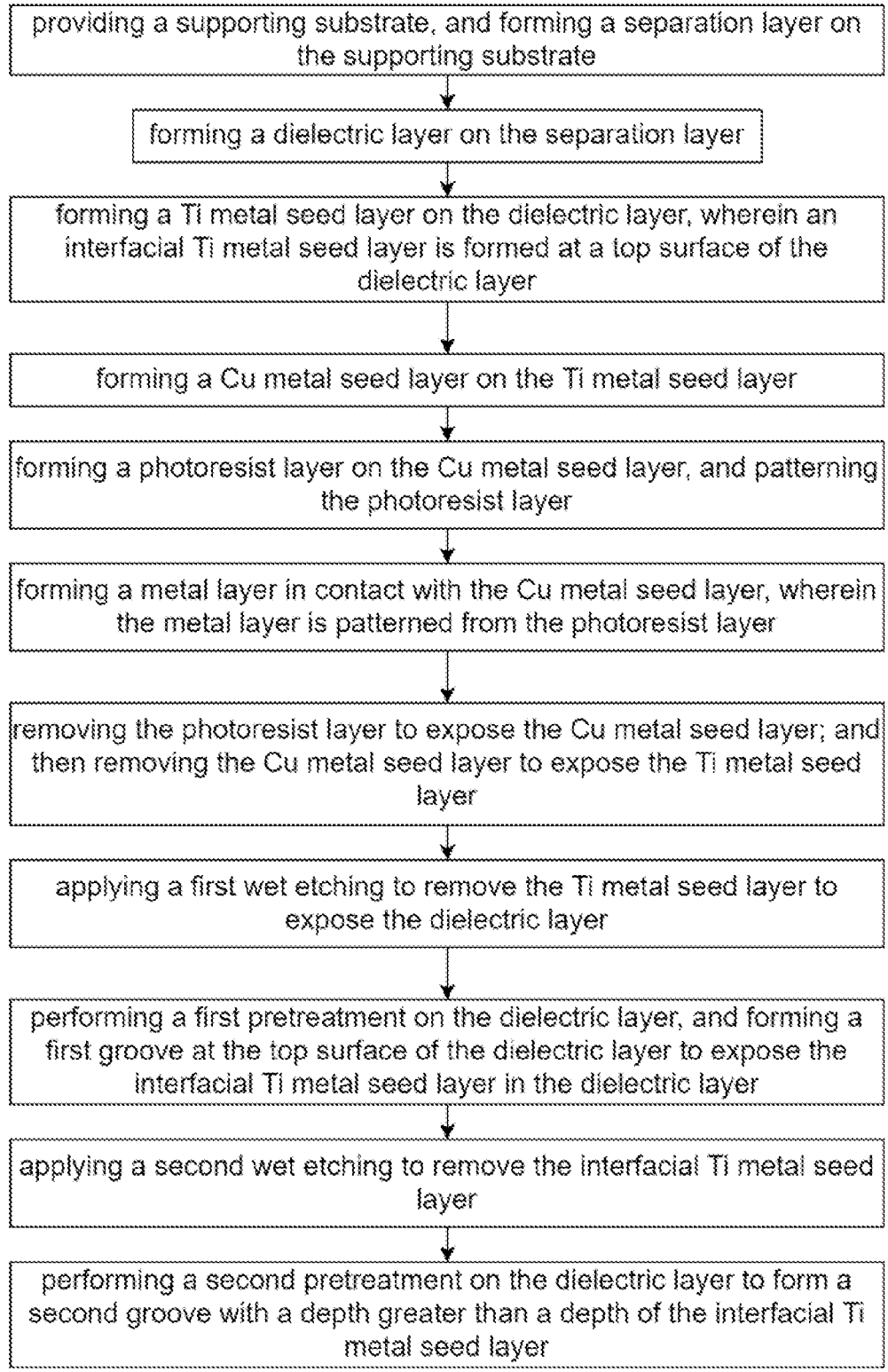
FIG. 1 is a flowchart illustrating a method for manufacturing a semiconductor structure according to the present disclosure.

Referring to FIG. 1, the present disclosure provides a method for manufacturing a semiconductor structure, which at least includes steps of: using a first wet etching to remove a Ti metal seed layer to expose a dielectric layer; performing a first pretreatment on the dielectric layer, and forming a first groove in the dielectric layer to expose an interfacial Ti metal seed layer in the dielectric layer; using a second wet etching to remove the interfacial Ti metal seed layer; and performing a second pretreatment on the dielectric layer to form a second groove with a depth greater than that of the interfacial Ti metal seed layer, which effectively removes the interfacial Ti metal seed layer and results in a depth difference between the bottom of the second groove and the interfacial Ti metal seed layer, thereby avoiding short circuits caused by the interfacial Ti metal seed layer, and improving device reliability.

FIG. 2-FIG. 14 show cross-sectional views of the intermediate structures after various steps in applying the method of manufacturing a semiconductor structure according to one embodiment.

Figure 2:
FIG. 2 shows a schematic cross-sectional view of an intermediate structure where a separation layer is formed on a substrate according to the present disclosure.

First, referring to FIG. 2, a supporting substrate 100 is provided and a separation layer 200 is formed on the supporting substrate 100.

Specifically, the supporting substrate 100 includes one of a glass substrate, a metal substrate, a semiconductor substrate, a polymer substrate, and a ceramic substrate. The separation layer 200 includes one of an adhesive tape and a polymer, so that a subsequent removal of the supporting substrate 100 process is simplified thus reduces any damage to the components. The separation layer 200 can be cured by ultraviolet curing or thermal curing process. In one embodiment, polymer is used as the separation layer 200. In some embodiments, the separation layer can be formed by using a spin coating process to coat the polymer on a surface of the supporting substrate 100, and then using an ultraviolet curing or thermal curing process to solidify and shape the polymer. The subsequent peeling-off process can also be achieved by heating the polymer.

Figure 3:
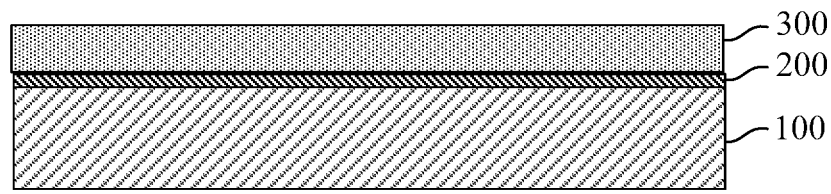
FIG. 3 shows a schematic cross-sectional view of an intermediate structure where a dielectric layer is formed.

Next, referring to FIG. 3, a dielectric layer 300 is formed on the separation layer 200.

Specifically, a chemical vapor deposition process or a physical vapor deposition process may be used to deposit the dielectric layer 300 on the separation layer 200. The dielectric layer 200 may compose of one of polyimide, epoxy, silica gel, polybenzoxazole (PBO), benzocyclobutene (BCB), silicon oxide, phosphosilicate glass (PSG), and fluorinated glass.

Figure 4:
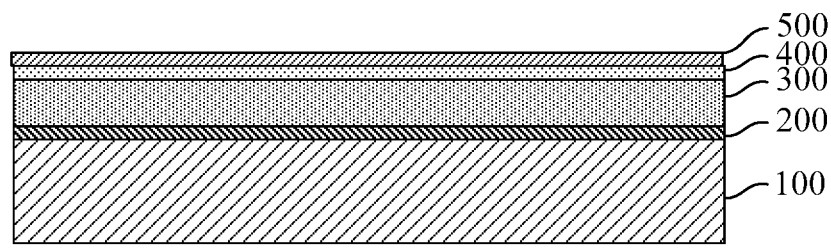
FIG. 4 shows a schematic cross-sectional view of an intermediate structure where a Ti metal seed layer and a Cu metal seed layer are formed.

Next, referring to FIG. 4, a Ti metal seed layer 400 and a Cu metal seed layer 500 are sequentially formed on the dielectric layer 300.

Figure 10:
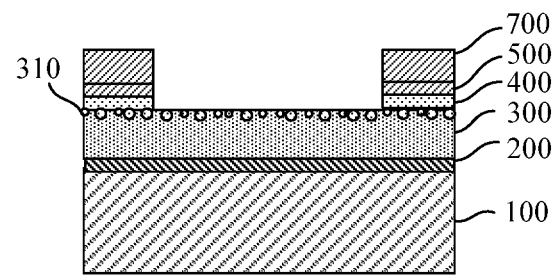
FIGS. 10-13 show various enlarged views of the area A in FIG. 9 during the formation of a first groove and a second groove.

Specifically, the Ti metal seed layer 400 may be formed by one of sputtering and electroless plating; the Cu metal seed layer 500 may be formed by one of sputtering, electroless plating, and electroplating. When forming the Ti metal seed layer 400, because the dielectric layer 300 has a surface roughness, some of the Ti atoms from the Ti metal seed layer 400 will diffuse into the dielectric layer 300 at a certain depth, forming a interfacial Ti metal seed layer 310, as shown in FIG. 10. The depth of the interfacial Ti metal seed layer 310 is in the range of 0.1 μm-0.4 μm. For example, the depth of the interfacial Ti metal seed layer 310 can be 0.2 μm, 0.3 μm, 0.4 μm, etc.

Figure 5:
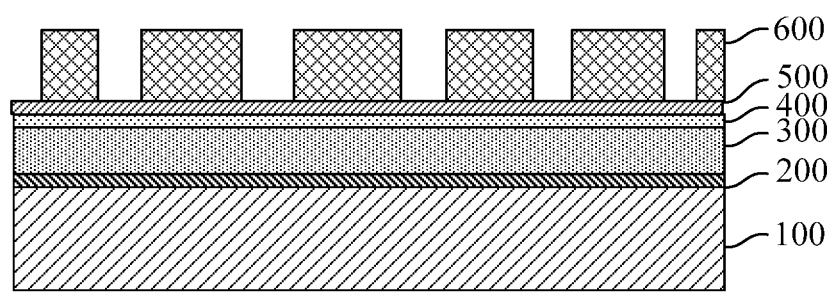
FIG. 5 shows a schematic cross-sectional view of an intermediate structure where a separation layer is formed.

Next, referring to FIG. 5, a photoresist layer 600 is formed on the Cu metal seed layer 500, and the photoresist layer 600 is patterned.

Specifically, the material of the photoresist layer includes one of positive photoresist, negative photoresist and hard mask. The patterned photoresist layer is sequentially coated, exposed, and developed. The patterned photoresist layer 600 is used as a mask to perform subsequent patterning processes. The thickness of the photoresist layer 600 can be from 50 μm to 200 μm. For example, the thickness of the photoresist layer 600 can be 100 μm, 150 μm, etc.

Figure 6:
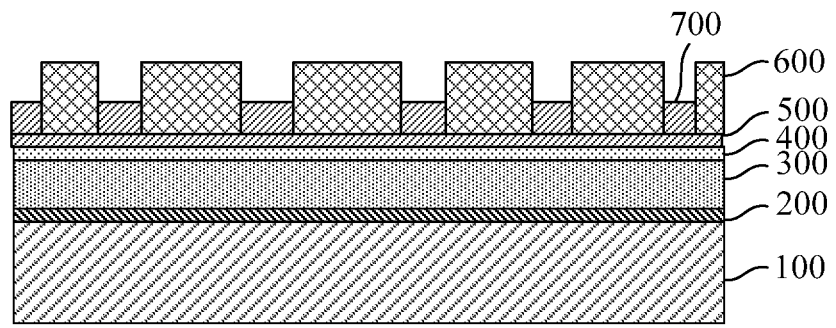
FIG. 6 shows a schematic cross-sectional view of an intermediate structure where a metal layer is formed.

Then, referring to FIG. 6, a metal layer 700 in contact with the exposed Cu metal seed layer 500 is formed. The thickness of the photoresist layer 600 may be decided by the thickness of the later filled-in metal layer 700.

Specifically, the material of the metal layer 700 includes one of copper, aluminum, silver, chromium, titanium, tantalum, molybdenum, and neodymium. The method for forming the metal layer 700 may include one of sputtering, electroless plating, and electroplating. In one embodiment, in order to reduce process complexity and improve bonding performance, the metal layer 700 is made of copper metal (Cu) and is prepared by an electroplating method.

Figure 7:
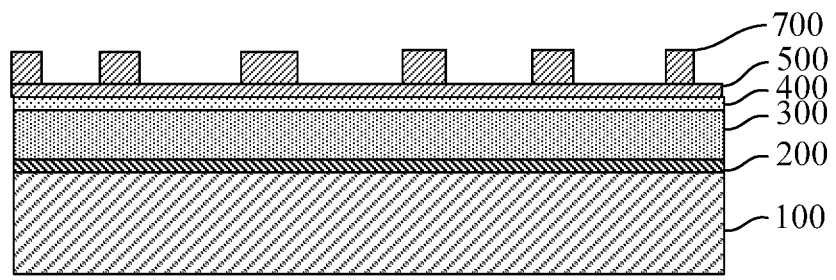
FIG. 7 shows a schematic cross-sectional view of an intermediate structure where a photoresist layer is removed.

Then, referring to FIG. 7, the photoresist layer 600 is removed to expose the Cu metal seed layer 500 between the Cu metal layer 700.

Figure 8:
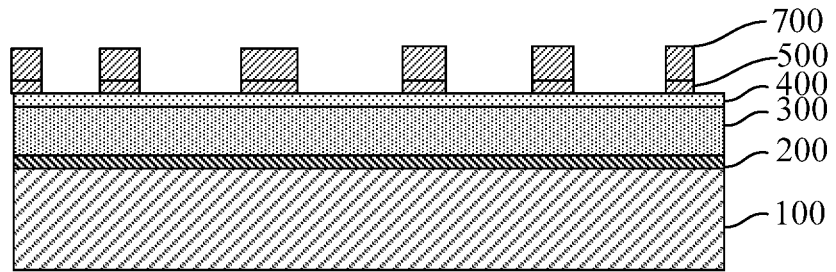
FIG. 8 shows a schematic cross-sectional view of an intermediate structure where a Cu metal seed layer is removed.

Next, referring to FIG. 8, the Cu metal seed layer 500 is removed to expose the Ti metal seed layer 400 between the Cu metal layer 700. The Cu metal seed layer 500 may be removed by wet etching.

Figure 9:
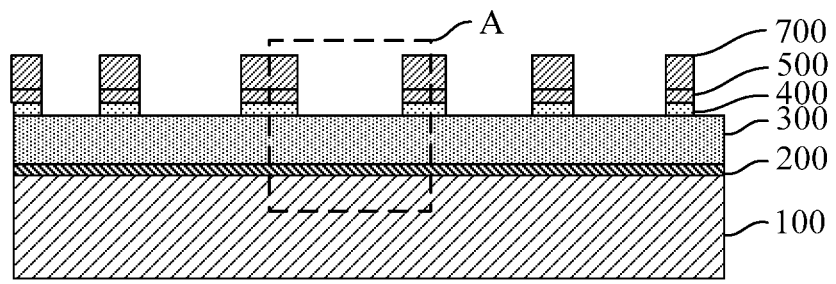
FIG. 9 shows a schematic cross-sectional view of an intermediate structure where a Ti metal seed layer is removed.

Next, referring to FIG. 9, the first wet etching is used to remove the Ti metal seed layer 400 to expose the dielectric layer 300.

Specifically, the temperature range of the first wet etching includes 30° C. to 50° C., and the range of the processing time of the first wet etching includes the 120 s to 150 s, for example, the temperature of the first wet etching may be 35° C., 38° C., 40° C., etc. The processing time of the first we etching may be 125 s, 136 s, 138 s, 140 s, 145 s, 150 s, etc. In examples, the temperature of the first wet etching is 38° C. and the processing time is 138 s.

FIG. 10 shows an enlarged view of the area A as shown in FIG. 9. It can be seen from FIG. 10 that after removing the Ti metal seed layer 400, the interfacial Ti metal seed layer 310 remains on the surface of the dielectric layer 300. The existence of the interfacial Ti metal seed layer 310 increases the risk of short circuit later, thus reducing the device's reliability.

Figure 11:
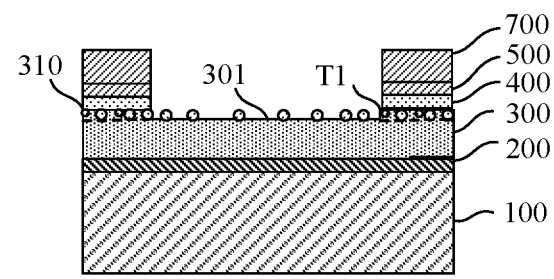

Next, referring to FIG. 11, a first pretreatment is performed on the dielectric layer 300, and a first groove 301 is formed in the dielectric layer 300 to expose the interfacial Ti metal seed layer 310 located in the top surface of the dielectric layer 300.

Specifically, the first pretreatment may include steps applying one of $O_2$, tetrafluoromethane ($CF_4$), and argon (Ar) gas to perform plasma treatment on the dielectric layer 300. In one embodiment, the first pretreatment applies $O_2$ for plasma treatment, and the plasma treatment lasts for about 60 s and forms a groove with a depth of T1. In one embodiment, the length of T1 is equal to the depth of the interfacial Ti metal seed layer 310 in order to completely expose the interfacial Ti metal seed layer 310, so that the second wet etching can thoroughly remove the interfacial Ti metal seed layer 310, thereby to avoid the risk of short circuit and improve the reliability of the device. In some embodiments, the depth T1 is smaller than the depth of the interfacial Ti metal seed layer 310, and the interfacial Ti metal seed layer 310 can still be all removed by the second wet etching and a second pretreatment, wherein a second groove 302 is formed by the second pretreatment, wherein the second groove 302 has a depth of T2, with T2 greater than the depth of the interfacial Ti metal seed layer 310.

Figure 12:
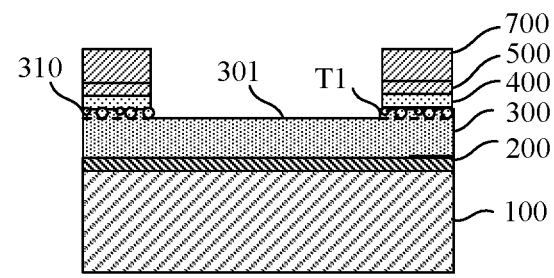

Referring to FIG. 12, the second wet etching is applied to remove the interfacial Ti metal seed layer 310.

Specifically, the temperature of the second wet etching includes the range of 30° C. to 50° C., and the processing time of the second wet etching includes the range of 40 s to 80 s. For example, the temperature of the second wet etching may be 35° C., 38° C., 40° C., etc. The processing time of the wet etching may be 50 s, 60 s, 70 s, etc. In one embodiment, the temperature of the second wet etching is set at 38° C., and the processing time is set at 60 s.

Figure 13:
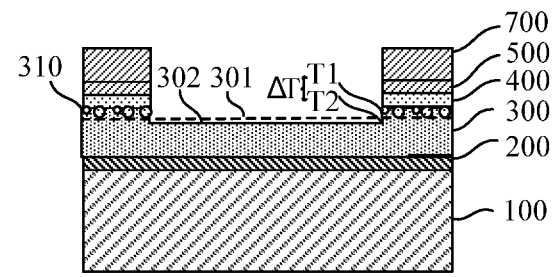

Next, referring to FIG. 13, a second pretreatment is performed on the dielectric layer 300 to form the second groove 302 with a depth greater than the depth of the interfacial Ti metal seed layer 310.

Specifically, the second pretreatment applies one of $O_2$, $CF_4$, and Ar to perform plasma treatment on the dielectric layer 300. In one embodiment, the first pretreatment and the second pretreatment both apply $O_2$ for plasma treatment, and the plasma treatment lasts for 60 s, and forms the first groove 301 with a depth of T1 and the second groove 302 with a depth of T2. In some embodiments, the length of T1 is equal to the depth of the interfacial Ti metal seed layer 310, and T2=2*T1, so that there is a depth difference ΔT between the bottom of the interfacial Ti metal seed layer 310 and the bottom of the second groove 302, in order to facilitate subsequent processes and provide reliability. The first pretreatment and the second pretreatment may also use different processes as needed to form the first groove 301 and the second groove 302, and the grooves may have various depths; when the depth T1 is equal to the depth of the interfacial Ti metal seed layer 310, the interfacial Ti metal seed layer 310 can be completely exposed by the first pretreatment and then the second wet etching can completely remove the interfacial Ti metal seed layer 310, which helps to avoid the risk of short circuit and improve the reliability of the device. In some other embodiments, the depth T1 is smaller than the depth of the interfacial Ti metal seed layer 310, and the interfacial Ti metal seed layer 310 can still be completely removed by the second wet etching and a second pretreatment, wherein the second groove 302 is formed by the second pretreatment, and the second groove 302 has a depth of T2, with T2 greater than the depth of the interfacial Ti metal seed layer 310.

Figure 14:
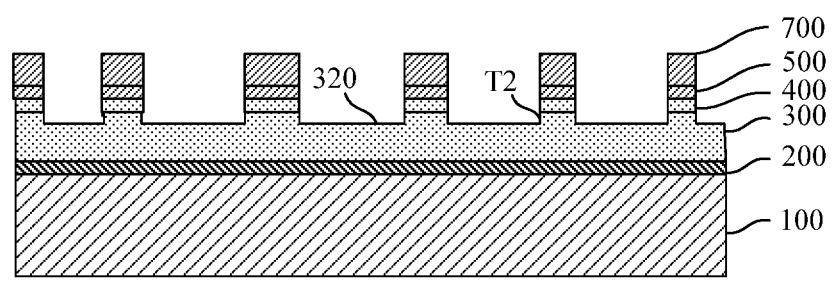
FIG. 14 shows a semiconductor structure after cleaning and drying according to one embodiment of the present disclosure.

Further, since the depth of T2 is greater than the depth of the interfacial Ti metal seed layer 310, there is also a depth difference between the bottom of the interfacial Ti metal seed layer 310 and the bottom of the second groove 302, so that the risk of short circuits can be further avoided and the reliability of the device can be improved after the interfacial Ti metal seed layer 310 is removed, As shown in FIG. 14, the method for manufacturing a semiconductor structure may further include cleaning and drying.

Specifically, in some embodiments, deionized water can be used to perform the cleaning. The deionized water can be inexpensive and impurity-free. The drying can be done through physical spin drying. One or more of nitrogen and inert gases can also be injected for drying, which may improve the efficiency of drying.

Referring to FIG. 13 and FIG. 14, the present disclosure also provides a semiconductor structure, which includes a supporting substrate 100, a separation layer 200, a dielectric layer 300, a Ti metal seed layer 400, a Cu metal seed layer 500, and a metal layer 700. The separation layer 200 is formed on the supporting substrate 100; the dielectric layer 300 is formed on the separation layer 200, and the dielectric layer 300 has a first groove 301 and a second groove 302 next to each other; the Ti metal seed layer 400 is formed on the dielectric layer 300, wherein the dielectric layer 300 in contact with the Ti metal seed layer 400 has a interfacial Ti metal seed layer 310, and the second groove 302 has a depth greater than the depth of the interfacial Ti metal seed layer 310; the Cu metal seed layer 500 is formed on the Ti metal seed layer 400; the metal layer 700 is formed on the Cu metal seed layer 500.

The semiconductor structure may be manufactured by methods including, but not limited to, the method for manufacturing a semiconductor structure disclosed above.

The first groove 301 and the second groove 302 can effectively help remove the interfacial Ti metal seed layer 310 in the dielectric layer 300, and there is a depth difference ΔT between the bottom of the second groove 302 and the bottom of the interfacial Ti metal seed layer 310, which helps avoid short circuits caused by the interfacial Ti metal seed layer 310 and improves device reliability.

In some embodiments, the range of the depth T1 of the first groove 301 includes 0.2 μm to 0.4 μm; the range of the depth T2 of the second groove 302 includes 0.3 μm to 1.2 μm.

In some embodiments, the relationship between the depth T2 of the second groove 302 and the depth T1 of the first groove 301 is given by T2=2*T1, that is, T2 is twice as deep as T1.

In some embodiments, the depth T1 of the first groove 301 is equal to or less than the depth of the interfacial Ti metal seed layer 310.

In some embodiments, the dielectric layer 300 includes one of a polyimide layer, an epoxy layer, a silica gel layer, a PBO layer, a BCB layer, a silicon oxide layer, a PSG layer, and a fluorine glass layer.

In some embodiments, the metal layer 700 includes one of a copper layer, an aluminum layer, a silver layer, a chromium layer, a titanium layer, a tantalum layer, a molybdenum layer, and a neodymium layer.

In some embodiments, the supporting substrate 100 includes one of a glass substrate, a metal substrate, a semiconductor substrate, a polymer substrate, and a ceramic substrate.

In some embodiments, the supporting substrate 100 includes a wafer-level supporting substrate.

In some embodiments, the separation layer 200 includes one of an adhesive tape and a polymer layer.

In summary, the present disclosure provides a semiconductor structure and a method for manufacturing the same. The method at least includes: applying a first wet etching to remove a Ti metal seed layer to expose a dielectric layer; performing a first pretreatment on the dielectric layer, and forming a first groove in the dielectric layer to expose a interfacial Ti metal seed layer in the dielectric layer; applying a second wet etching to remove the interfacial Ti metal seed layer; and performing a second pretreatment on the dielectric layer to form a second groove with a depth greater than the depth of the interfacial Ti metal seed layer. These pretreatments can effectively remove the interfacial Ti metal seed layer and result in a depth difference between the bottom of the second groove and the interfacial Ti metal seed layer, thereby avoiding short circuits caused by the interfacial Ti metal seed layer, and improving device reliability.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

What is claimed is:

1. A method for manufacturing a semiconductor structure, comprising:
   providing a supporting substrate;
   forming a separation layer on the supporting substrate;
   forming a dielectric layer on the separation layer;
   forming a Ti metal seed layer on the dielectric layer, wherein an interfacial Ti metal seed layer is formed at a top surface of the dielectric layer;
   forming a Cu metal seed layer on the Ti metal seed layer;
   forming a photoresist layer on the Cu metal seed layer, and patterning the photoresist layer;
   forming a metal layer in contact with the Cu metal seed layer, wherein the metal layer is patterned from the photoresist layer;
   removing the photoresist layer to expose the Cu metal seed layer;
   removing the Cu metal seed layer to expose the Ti metal seed layer;
   applying a first wet etching to remove the Ti metal seed layer to expose the dielectric layer;
   performing a first pretreatment on the dielectric layer, and forming a first groove at the top surface of the dielectric layer to expose the interfacial Ti metal seed layer in the dielectric layer;
   applying a second wet etching to remove the interfacial Ti metal seed layer; and
   performing a second pretreatment on the dielectric layer to form a second groove with a depth greater than a depth of the interfacial Ti metal seed layer.

2. The method for manufacturing a semiconductor structure according to claim 1, wherein the first pretreatment includes plasma treatment of the dielectric layer by applying one of $O_2$, $CF_4$, and Ar, and the second pretreatment includes plasma treatment of the dielectric layer by applying one of $O_2$, $CF_4$, and Ar.

3. The method for manufacturing a semiconductor structure according to claim 1, wherein a depth of the first groove includes a range of 0.2 μm to 0.4 μm, and the depth of the second groove includes a range of 0.3 μm to 1.2 μm.

4. The method for manufacturing a semiconductor structure according to claim 1, wherein a temperature of the first wet etching includes a range of 30° C. to 50° C., and a range of processing time of the first wet etching includes a range of 120 s to 150 s; wherein a temperature of the second wet etching includes a range of 30° C. to 50° C., and a range of processing time of the second wet etching includes a range of 40 s to 80 s.

5. The method for manufacturing a semiconductor structure according to claim 1, wherein the dielectric layer is made of one of polyimide, epoxy, silica gel, polybenzoxazole, benzocyclobutene, silicon oxide, phosphosilicate glass, and fluorinated glass.

6. The method for manufacturing a semiconductor structure according to claim 1, wherein the Ti metal seed layer is formed by one of sputtering and electroless plating, wherein the Cu metal seed layer is formed by one of sputtering method, electroless plating, and electroplating, and wherein the metal layer is formed by one of sputtering method, electroless plating, and electroplating.

* * * * *